United States Patent [19]

Kim

[11] Patent Number: 5,754,489
[45] Date of Patent: May 19, 1998

[54] SERIAL ACCESS MEMORY APPARATUS

[75] Inventor: Young Ho Kim, Kyungki-do, Rep. of Korea

[73] Assignee: LG Semicon Co., Ltd., Choongcheongbuk-do, Rep. of Korea

[21] Appl. No.: 766,896

[22] Filed: Dec. 13, 1996

[30] Foreign Application Priority Data

Dec. 16, 1995 [KR] Rep. of Korea ............... 51092/1995

[51] Int. Cl.$^6$ ...................................................... G11C 8/00
[52] U.S. Cl. .............................. 365/221; 365/230.08
[58] Field of Search ....................... 365/221, 230.08, 365/226

[56] References Cited

U.S. PATENT DOCUMENTS 5,377,154 12/1994 Takasugi ................................. 365/221

Primary Examiner—Amir Zarabian
Assistant Examiner—Michael T. Tran
Attorney, Agent, or Firm—Morgan, Lewis & Bockius LLP

[57] ABSTRACT

An improved serial access memory apparatus which is capable of more stably and rapidly processing a data transmission between a memory cell array and a serial access memory or between serial access memories, which includes a first power controller for generating a first power control signal having different levels and for applying it to a first serial access memory in accordance with a first write enable signal outputted from a read/write controller for controlling a read/write operation of a memory cell array, and a second power controller for generating a second power control signal having different levels and for applying it to a second serial access memory in accordance with a second write enable signal outputted from the read/write controller.

10 Claims, 4 Drawing Sheets

SERIAL ACCESS MEMORY APPARATUS

BACKGROUND OF THE INVENTION

1. Field of the Invention

The present invention relates to a memory apparatus, and particularly to an improved serial access memory apparatus which is capable of more stably enabling a data transmission between a memory cell array and a serial access memory or between serial access memories by using a power controller for generating power control signals having different levels when inputting/outputting serial data.

2. Description of the Conventional Art

FIG. 1 shows a conventional serial access memory apparatus, which includes a transmission controller 10 for controlling the transmission of data in accordance with a control signal TR which is externally applied thereto when sequentially accessing the memory, a read/write controller 12 for outputting a control signal so as to control the read/write operation of the memory apparatus in accordance with an externally applied read/write signal R/W, power controllers 14 and 16 for outputting power control signals REG_P1 and REG_P2 in accordance with write enable signals WEB 1 and WEB2 outputted from the read/write controller 12, a controller 18 for receiving an externally applied control signal CRL and for generating a control signals so as to control the memory apparatus, an address buffer 20 for receiving an externally applied address signal ADS and for outputting a row address signal RADS and a column address signal CADS, a serial address generator 22 for generating a serial address signal in accordance with the column address signal CADS outputted from the address buffer 20 and an externally applied clock signal, a serial address decoder 24 for decoding the serial address signal outputted from the serial address generator 22, a row decoder 26 for decoding the row address signal RADS outputted from the address buffer 20 and for selecting one word line, a column decoder 28 for decoding the column address signal CADS outputted from the address buffer 20, a gate unit 30 for selecting a bit line in accordance with an output signal of the column decoder 28, a memory cell array 32 for storing the data in the cell corresponding to the selected word line and bit line or outputting the stored data, a random output buffer 32 for buffering the data applied thereto from the memory cell array 32 and for externally outputting the stored data in accordance with the control signal outputted from the read/write controller 12, a random input buffer 36 for buffering externally inputted data and for applying it to the memory cell array 32 in accordance with the control signal outputted from the read/write controller 12, serial access memories 40 and 44 for inputting/outputting the serial data in accordance with the power control signals REG-P1 and REG-2 applied thereto from the power controllers 14 and 16, a transmission unit 38 for performing data transmission between the memory cell array 32 and the serial access memory 40 in accordance with the control of the transmission controller 10, a transmission unit 42 for performing the data transmission between the serial access memories 40 and 44 in accordance with the control of the transmission controller 10, a gate unit 46 having a plurality of gates which are selected by the serial address decoder 24 for outputting the serial data applied thereto from the serial access memory 44 or for applying the serial data to the serial access memory 44, a serial output buffer 48 for buffering the data outputted from the gate unit 46 and for externally outputting, and a serial input buffer 50 for applying the externally applied serial data to the serial access memory 44 through the gate unit 46.

As shown in FIG. 2, the power controller 14 includes a PMOS transistor 14a having its source connected for receiving a high level voltage Vcc, its gate connected for receiving the write enable signal WEB1 outputted from the read/write controller 12, and its drain outputting the power control signal REG_P1, and a PMOS transistor 14b having its source connected for receiving the high level voltage VCC, its gate connected for receiving a low level voltage Vss, and its drain connected to the drain of the PMOS transistor 14a for outputting the power control signal REG_P1. Here, the capacity of the PMOS transistor 14b is greater than that of the PMOS transistor 14a, and the power controller 16 has the same construction as the power controller 14.

FIG. 3 is a circuit diagram showing a serial access memory cell of the serial access memory of FIG. 1.

As shown therein, the serial access memories 40 and 44 include a plurality of serial access memory cells. Each serial access memory cell of the serial access memory 40 includes a PMOS transistor 40a having its source connected for receiving the power control signal REG_P1 outputted from the power controller 14, its gate connected to a bit line BLB, and its drain connected to a bit line BL, an NMOS transistor 40b having its drain connected to the drain of PMOS 40a and to the bit line BL, having its gate commonly connected to the gate of the PMOS transistor 40a and the bit line BLB and having its source connected for receiving the low level voltage Vss, a PMOS transistor 40c having its source connected for receiving the power control signal REG_P1 outputted from the power controller 14, its gate connected to the bit line BL, and its drain connected to the bit line BLB, and an NMOS transistor 40d having its drain commonly connected to the drain of the PMOS transistor 40c and to the bit line BLB, its gate commonly connected to the gate of the PMOS transistor 40c and to the bit line BL, and its source connected for receiving the low level voltage Vss. Here, the capacitor C1 denotes all parasitic capacitors connected to the bit line BL, and the capacitor C2 denotes all parasitic capacitors connected to the bit line BLB. The serial access memory 44 has the same construction as the serial access memory 40.

The operation of the conventional serial access memory apparatus will now be explained with reference to the accompanying drawings.

First, in case of a random input/output, the random read/write mode is determined by the read/write controller 12 and the controller 18, and the address buffer 20 applies the row address signal RADS to the row decoder 26 in accordance with the control of the controller 18, and the row decoder 26 decodes the inputted row address signal RADS and selects one word line. In addition, the bit line corresponding to the column address CADS applied from the address buffer 20 is selected by the column decoder 28 and the gate unit 30.

In case of a random read among the memory cells of the memory cell array 32, the data stored in the memory cell connected to the selected word line is applied to the random output buffer 34 via the selected bit line, and the random output buffer 34 buffers the read data in accordance with the control of the read/write controller 12 and then outputs it. In addition, in case of a random write, the random input buffer 36 buffers the inputted data in accordance with the control of the read/write controller 12, and applies it to the memory cell array 32 via the selected bit line.

Meanwhile, in case of a serial input/output, the serial read mode is determined by the controller 18 and the read/write controller 12, and in case of the random input/output, the word line and bit line are selected in accordance with the control of the controller 18.

When the high level voltage Vcc and low level voltage Vss are supplied to the selected bit line, the transmission controller 10 turns on the transmission unit 38, and the transmission unit 38 transmits the data carried on the selected bit line to the serial access memory 40. At this time, the read/write controller 12 applies the write enable signal WEB1 of a high level to the power controller 14, and the PMOS transistor 14a of the power controller 14 is turned off, and the power control signal REG_P1 of a high level voltage Vcc applied to the source of the PMOS transistor 14b is applied to the serial access memory 40, thus enabling an easier data transmission.

Thereafter, the transmission controller 10 turns off the transmission unit 38, and the read/write controller 12 outputs the write enable signal WEE1 of a low level, and turns on the PMOS transistor 14a of the power controller 14, and stabilizes the data stored in the serial access memory 40, and applies the write enable signal WEB2 of a high level to the power controller 16.

A PMOS transistor (not shown) of the power controller 16 which receives the write enable signal WEB2 of a high level through the gate thereof is turned off, and the transmission controller 10 turns on the transmission unit 42, so that the transmission unit 42 transmits the data stored in the serial access memory 40 to the serial access memory 44. Thereafter, the transmission controller 10 turns off the transmission unit 42, and the read/write controller 12 turns on the PMOS transistor (not shown) of the power controller 16 and stabilizes the data stored in the serial access memory 44.

After one word line is selected by the row decoder 26, during the turning off of the transmission unit 42, the address buffer 20 applies the column address signal CADS to the serial address generator 22.

After the preparation for performing a serial read are completed, when the clock signal CLK is applied to the serial address generator 22, the serial address generator 22 outputs the start address of the serial address to the serial address decoder 24. Thereafter, the serial address decoder 24 selects one gate corresponding to the serial address inputted thereto among a plurality of gates of the gate unit 46, and then the data stored in the serial access memory 44 is outputted to the serial output buffer 48 through the selected gate. In addition, the serial output buffer 48 buffers the data and outputs it in accordance with the control of the read/write controller 12.

When the next clock signal CLK is applied to the serial address generator 22, the serial address generator 22 generates the next serial address, and when the data which are inputted/outputted in series is "IN"-bits, the data of the "N"-bits stored in the serial access memory 44 is outputted through the serial output buffer 48 in series in the above-described manner.

During the output of the data stored in the serial access memory 44, the row decoder 26 receives the row address signal RADS outputted from the address buffer 20 in accordance with the control of the controller 18 and selects the next word line, and the data of the selected word line is transmitted to the serial access memory 40 through the transmission unit 38, and then the transmission unit 38 is turned off.

When a predetermined amount of the data stored in the serial access memory 44 has been outputted, the transmission unit 42 is turned off in accordance with the control of the transmission controller 10, and transmits the data stored in the serial access memory 40 to the serial access memory 44, and then is turned off. Thereafter, a new start address of the serial address outputted from the serial address generator 22 is inputted to the serial address decoder 24, and the data of the "N"-bits corresponding to the new start address is outputted from the serial access memory 44.

Meanwhile, in case of a serial write of the serial input/output, the serial write mode is determined by the read/write controller 12 and the controller 18, and the address buffer 20 applies the column address signal CADS to the serial address generator 22 in accordance with the control of the controller 18.

After the preparation for performing the serial writing are finished, when the clock signal CLK is applied to the serial address generator 22, the serial address generator 22 outputs the start address of the serial address to the serial address decoder 24. Thereafter, the serial address decoder 24 decodes the inputted start address, and selects the "N"-number of gates among the gates of the gate units 46. The serial data is applied to the serial input buffer 50 and buffered thereby in accordance with the control of the read/write controller 12, and then the data is written into the serial access memory cell of the serial access memory 44 corresponding to the selected gate of the gate unit 46. At this time, the PMOS transistor (not shown) of the power controller 16 which receives the write enable signal WEB2 through the gate thereof is turned off.

When the next clock signal CLK is applied to the serial address generator 22, the serial address generator 22 generates the next serial address, and the serial data inputted thereto through the serial input buffer 50 is written into the serial access memory cell of the serial access memory 44 corresponding to the next serial address.

In accordance with the above-described operation, when the serial data of "N"-bits is all written into the serial access memory 44, the PMOS transistor (not shown) of the power controller 16 is turned on, and the PMOS transistor 14a of the power controller 14 is turned off, and then the transmission unit 42 is turned off. Thereafter, the serial data of "N"-bits stored in the serial access memory 14a is transmitted to the serial access memory 40 through the transmission unit 42, and the transmission unit 42 is turned off, and the PMOS transistor 14a of the power controller 14 is turned on.

Thereafter, in accordance with the control of the controller 18, the row decoder 26 receives the row address signal RADS applied from the address buffer 20 and selects one word line. At this time, the transmission unit 38 is turned on and transmits the data stored in the serial access memory 40 to the memory cell array 32. The thusly transmitted data is stored in the memory cell of the memory cell array 32 connected to the word line selected by the row decoder 26.

Therefore, after the serial data of "N"-bits stored in the serial access memory 44 is transmitted to the serial access memory 40 through the transmission unit 42, the serial address generator 22 generates a new start address, so that the externally applied serial data can be stored in the memory cell array 32 in series.

However, the conventional serial access memory apparatus has disadvantages in that when the transmission unit 42 is turned on for a data communication between the serial access memory 40 and the serial access memory 44, the impedance of the power controller 14 and the impedance of the power controller 16 may be different from each other. Therefore, the node of the bit line connected to the serial access memory 40 and the node of the bit line connected to the serial access memory 44 may not have the same condition due to the parasitic capacitance of the bit lines BL and BLB. Therefore, accurate data communication is not achieved.

SUMMARY OF THE INVENTION

Accordingly, it is an object of the present invention to provide an improved serial access memory apparatus, which overcomes the problems encountered in the conventional serial access memory apparatus.

It is another object of the present invention to provide an improved serial access memory apparatus which is capable of more stably and rapidly processing a data transmission between a memory cell array and a serial access memory or serial access memories.

To achieve the above objects, there is provided a serial access memory apparatus, which includes a first power controller for generating a first power control signal having different levels and for applying the first power control signal to a first serial access memory in accordance with a first write enable signal outputted from a read/write controller for controlling a read/write operation of a memory cell array; and a second power controller for generating a second power control signal having different levels and for applying the second power control signal to a second serial access memory in accordance with a second write enable signal outputted from the read/write controller.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
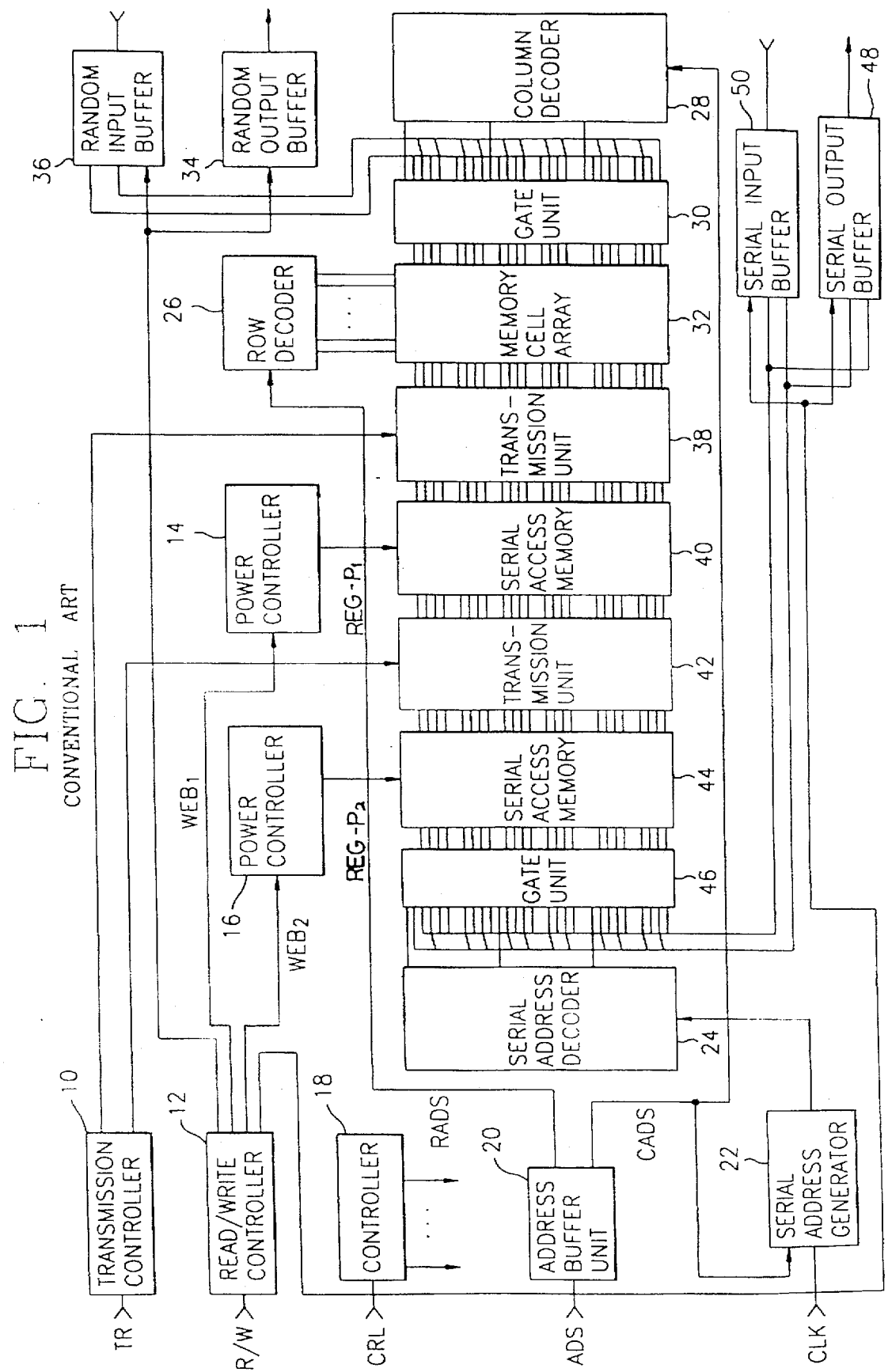
FIG. 1 is a block diagram showing a conventional serial access memory apparatus.
Figure 2:
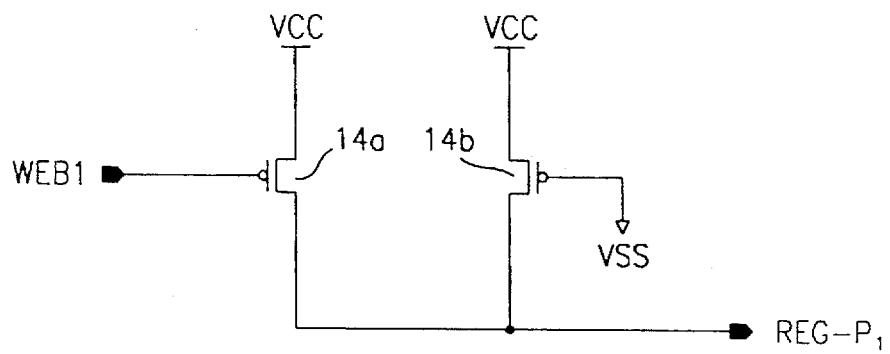
FIG. 2 is a detailed circuit diagram showing a power controller of the serial access memory apparatus of FIG. 1.
Figure 4:
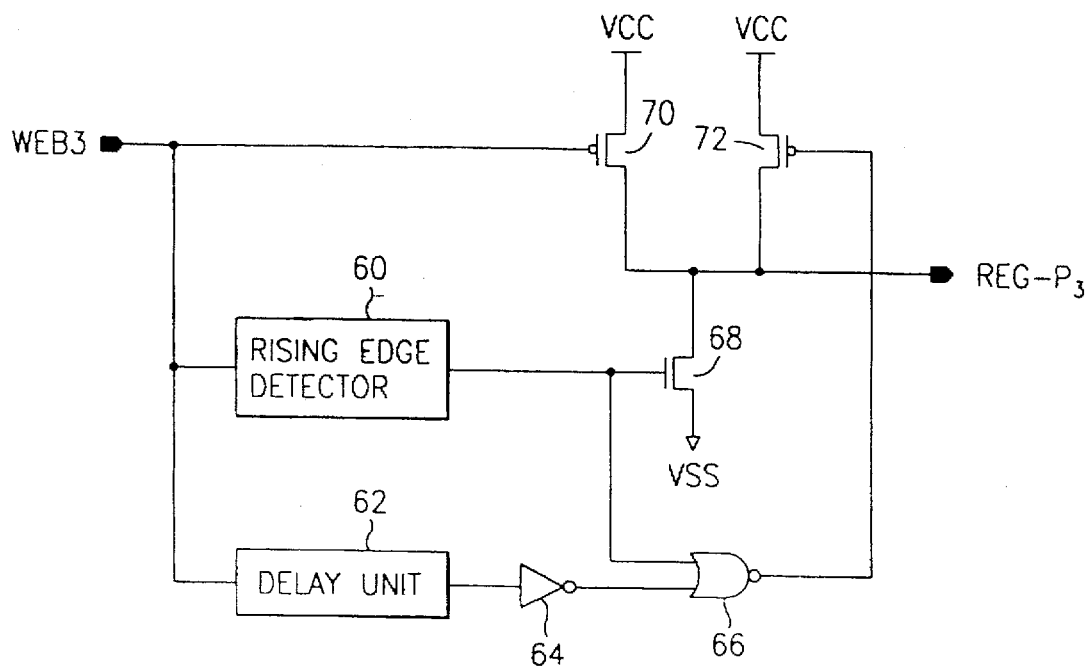
FIG. 4 is a detailed circuit diagram of a power controller of a serial access memory apparatus according to the present invention.
Figure 5:
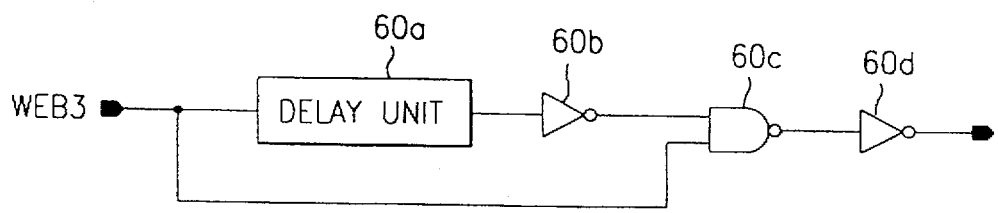
FIG. 5 is a detailed circuit diagram of a rising edge detector of the power controller of FIG. 4 according to the present invention.
Figure 6:
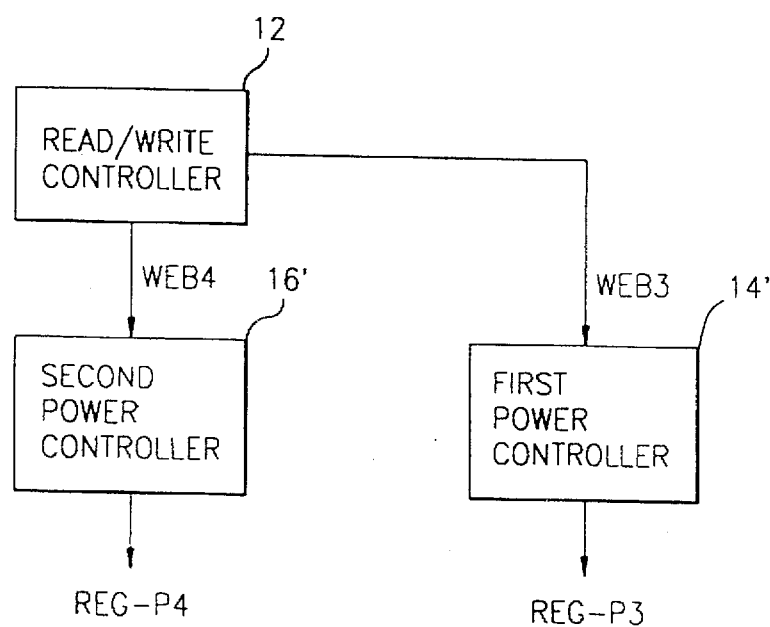
FIG. 6 is a block diagram of a power controller according to the present invention.

As shown in FIGS. 4 through 6, the serial access memory apparatus according to the present invention includes first and second power controllers 14' and 16', as shown in FIG. 6, for receiving write enable signals WEB3 and WEB4 instead of the conventional power controllers 14 and 16 of FIG. 1. The other elements except for the above-mentioned power controllers 14' and 16' are the same as the conventional memory apparatus of FIG. 1.

The power controller 14' includes a rising edge detector 60 for detecting the rising edge of a write signal WEB3, a delay unit 62 for delaying the write enable signal WEB3, an inverter 64 for inverting the output signal of the delay unit 62, a NOR gate 66 for NORing the output signals of the inverter 64 and the rising edge detector 60, an NMOS transistor 68 having its gate connected for receiving the output signal of the rising edge detector 60 and its source connected for receiving a low level voltage Vss, a PMOS transistor 70 having its gate connected for receiving the write enable signal WEB3, its source connected for receiving a high level voltage Vcc, and its drain connected to the drain of the NMOS transistor 68, and an NMOS transistor 72 having its gate connected for receiving the output signal of the NOR gate 66, its drain connected for receiving the high level voltage Vcc, and its source commonly connected with the drain of the NMOS transistor 68 and the drain of the PMOS transistor 70, for outputting a power control signal REG_P3.

As shown in FIG. 5, the rising edge detector 60 includes a delay unit 60a for delaying the write enable signal WEB3, an inverter 60b for inverting the output signal of the delay unit 60a, a NAND-gate 60c for NANDing the output signal of the inverter 60b and the write enable signal WEB3, and an inverter 60d for inverting the output signal of the NAND-gate 60c.

The power controller 16' has the same construction as the power controller 14'.

The operation and effects of the serial access memory apparatus according to the present invention will now be explained with reference to the accompanying drawings.

First, referring to FIG. 4, the write enable signal WEB3 becomes high level in the serial read mode, and becomes low level in the serial write mode and random mode.

When the write enable signal WEB3 has a low level, the PMOS transistor 70 is turned on in accordance with the write enable signal WEB3 of a low level being applied to its gate, and the rising edge detector 60 applies the low level signal to the NOR gate 66 and to the gate of the NMOS transistor 68. Namely, as shown in FIG. 5, the write enable signal WEB3 is inputted to the inverter 60b through the delay unit 60a of the rising edge detector 60, and the inverter 60b outputs a high level signal. The NAND-gate 60c NANDs the high level signal outputted from the inverter 60b and the low level write enable signal WEB3 and outputs a high level signal. The inverter 60d inverts the high level signal outputted from the NAND gate 60c and outputs the low level signal.

Therefore, the NMOS transistor 68 is turned off in accordance with the low level signal outputted from the rising edge detector 60.

The delay unit 62 delays the write enable signal WEB3 of low level, and the inverter 64 inverts the write enable signal WEB3 delayed by the delay unit 62 and outputs a high level signal.

The NOR gate 66 NORs the low level signal outputted from the rising edge detector 60 and the high level signal outputted from the inverter 64 and outputs a low level signal to the gate of the NMOS transistor 72. Therefore, the NMOS transistor 72 is turned off.

As a result, the power control signal REG_P3 is referred to the high voltage Vcc applied to the source of the PMOS transistor 70.

When the write enable signal WEB3 transits from a low level to a high level, the PMOS transistor 70 is turned off, and the rising edge detector 60 outputs a high level pulse signal after the time delay period of the delay unit 60a.

Namely, referring to the rising edge detector 60 as shown in FIG. 5, the write enable signal WEB3 transited to the high level is directly applied to one input of the NAND gate 60c, and is delayed by the delay unit 60a for a predetermined time. Thereafter, the thusly delayed signal is inverted by the inverter 60b, and is applied to the other input of the NAND gate 60c.

The NAND gate 60c outputs a low level signal for a predetermined time, and the inverter 60d outputs a high level signal for a predetermined time.

Therefore, the NMOS transistor 68 is turned on for a predetermined time, and the power control signal REG_P3 becomes the low level voltage Vss, and the power controller 14' applies the power control signal REG_P3 of the low level voltage Vss to the serial access memory 40 for a predetermined time.

Meanwhile, the delay unit 62 receives and delays the write enable signal WEB3 which is transited to the high level, and the inverter 64 inverts the signal delayed by the delay unit 62 and outputs a low level signal. Here, the time delay of the delay unit 62 is shorter than that of the delay unit 60a of the rising edge detector 60.

Therefore, the NMOS transistor 72 is turned as the NOR gate 66 applies the high level signal to the gate of the NMOS transistor 72 only when the low level signal is outputted from the rising edge detector 60 and the inverter 64. At this time, the NMOS transistor 68 maintains a turned-off state. The output signal of the inverter 64 is transited to the high level earlier than the output signal of the rising edge detector 60, and the NOR gate 66 outputs a low level signal, and the NMOS transistor 72 is turned off. Thereafter, the output signal of the rising edge detector 60 is transited to the high level, and the NMOS transistor 68 is turned on. Therefore, the NMOS transistor 68 and the NMOS transistor 72 are not turned on at the same time.

Therefore, when the NMOS transistor 72 is in the turned-on state, the NMOS transistor 68 remains turned-off. Here, the difference voltage Vcc-Vtn between the high level voltage Vcc applied to the source of the NMOS transistor 72 and the threshold voltage Vt of the NMOS transistor 68 is referred to the power control signal REG_P3. Therefore, there occurs a predetermined voltage difference between the power control signal REG_P3 which occurs when the write enable signal WEB3 is transited from the low level to the high level and the power control signal REG_P3 which occurs when the write enable signal WEB3 maintains a low level. The power control signal REG_P3 having different level in accordance with the input/output mode of the data is applied to the serial access memory 40, and the power control signal REG_P4 is generated by the power controller 16' and then is applied to the serial access memory 44 as well.

The operation of the serial access memory apparatus including the power controllers 14' and 16' will be described in more detail.

In the serial read mode, the write enable signal WEB3 of a low level is applied to the power controller 14' and when the write enable signal WEB4 of a high level is applied to the power controller 16', the power controller 14' outputs the power control signal REG_P3 at the high level voltage Vcc to the serial access memory 40, and the power controller 16' outputs the power control signal REG_P4 of the voltage Vcc—Vtn to the serial access memory 44.

Figure 3:
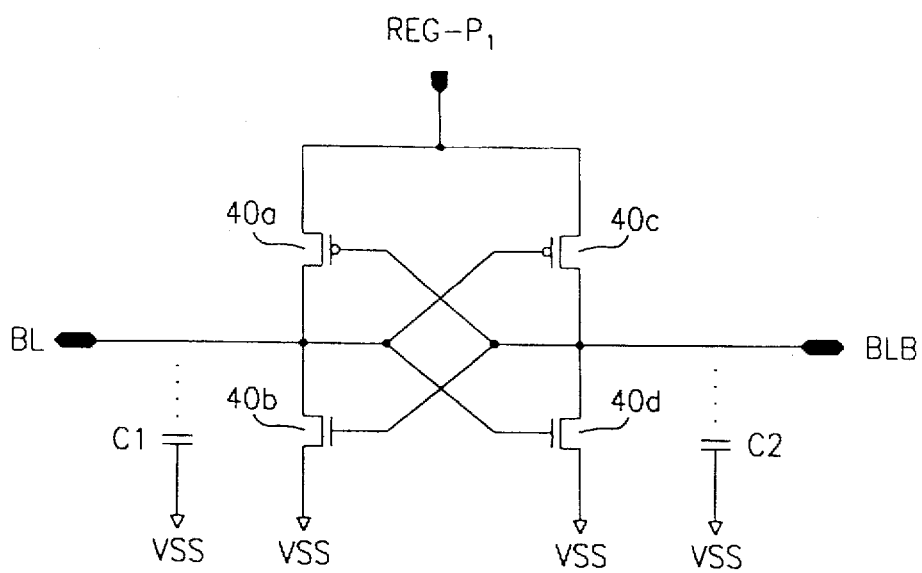
FIG. 3 is a circuit diagram showing a serial access memory cell of the serial access memory of FIG. 1.

At this time, when bit lines BL1 and BLB1 are connected to one serial access memory cell of the serial access memory 40, and bit lines BL2 and BLB2 are connected to one serial access memory cell of the serial access memory 44 as shown in FIG. 3, the voltage levels are different between the bit line BL1 and the bit line BL2.

Namely, when the high level voltage Vcc is applied to the bit line BL1, the low level voltage Vss to the bit line BLB1, the low level voltage Vss to the bit line BL2, and the voltage Vcc-Vtn to the bit line BLB2, respectively, and when the transmission unit 42 is turned on, the voltage Vcc/2 is applied to the bit line BL2, and the voltage (Vcc-Vtn)/2 is applied to the bit line BLB2. Therefore, the voltage of the bit line BL2 becomes lower than that of the bit line BLB2, and the voltage Vcc of the bit line BL1 is applied to the bit line BL2, and the voltage Vss of the bit line BLB1 is applied to the bit line BLB2, so that the data stored in the memory cell of the memory 40 is transmitted to the memory cell of the serial access memory 44.

Meanwhile, in the serial write mode, the power controller 14' receives the high level write enable signal WEB3, and outputs the power control signal REG_P3 of the voltage Vcc-Vtn to the serial access memory 40, and the power controller 16' receives the low level write enable signal WEB4, and outputs the power control signal REG_P4 to the serial access memory 44. Thereafter, the data stored in the memory cell of the serial access memory 44 is transmitted to the memory cell of the memory 40 in accordance with the same operation as previously described.

Here, the voltages Vcc and Vcc-Vtn supplied to the serial access memories 40 and 44 may be substituted by the voltages Vcc and Vcc+Vtn. In addition, the power control signals REG_P3 and REG_P4 supplied to the serial access memories 40 and 44 have a level difference only when a predetermined data is transmitted between the serial access memories 40 and 44. After the data is transmitted thereto, they can be adjusted to have the same level.

As described above, the serial access memory apparatus according to the present invention is directed to enabling a more stable transmission between serial access memories by using power controllers for supplying power control signals having different levels to serial access memories having a bidirectional characteristic in accordance with the input/output mode of the data.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A serial access memory apparatus having first and second serial access memories, and a memory cell array, comprising:

a read/write controller for controlling a read/write operation of the memory cell array by outputting first and second write enable signals;

a first power controller for receiving the first write enable signal having one of a first and a second level and applying a first power control signal to the first serial access memory; and a second power controller for receiving the first write enable signal having the other one of a first and second levels and applying a second power control signal to the second serial access memory, wherein said first power controller includes:

a rising edge detector for detecting the rising edge of the first write enable signal;

a delay unit for delaying the first write enable signal:

an inverter for inverting the output Signal of the delay unit;

a NOR gate fox NORing the output signal of the inverter and the output signal of the rising edge detector;

a first NMOS transistor having a gate for receiving the output signal of the rising edge detector and a source for receiving a low level voltage;

a PMOS transistor having a gate for receiving the first write enable signal a source for receiving a high level voltage and a drain connected to a drain of the NMOS transistor; and a second NMOS transistor having a gate for receiving the output signal of the NOR gate a drain for receiving the high level voltage, and a source commonly connected to the drain of the first NMOS transistor and the drain of the EMOS transistor for outputting the first power control signal.

2. The apparatus of claim 1, wherein said first and second power controllers output the first and second power control signals at predetermined levels different from each other when serial data is transmitted between the first and second serial access memories.

3. The apparatus of claim 1, wherein said first power controller outputs the first power control signal having a predetermined level higher than the second power control signal outputted from the second power controller when serial data is read from the memory cell array.

4. The apparatus of claim 1, wherein said first power controller outputs the first power control signal having a predetermined level lower than the second power control signal outputted from the second power controller when serial data is written in the memory cell array.

5. The apparatus of claim 1, wherein said rising edge detector includes:

a delay unit for delaying the first write enable signal;

a first inverter for inverting the output signal of the delay unit;

a NAND gate for NANDing the output signal of the first inverter and the first write enable signal; and a second inverter for inverting the output signal of the NAND gate.

6. A serial access memory apparatus having first and second serial access memories and a memory cell array comprising;

read/write controller for controlling read/write operation of the memory cell array by outputting first and second write enable signals:

a first power controller for receiving the first write enable signal having one of a first and a second level and applying a first power control signal to the first serial access memory; and a second power controller for receiving the first write enable signal having the other one of the first and second levels and applying a second power control signal to the second serial access memory.

wherein said second power controller includes:

a rising edge detector for detecting a rising edge of the second write enable signal;

a delay unit for delaying the second write enable signal;

an inverter for inverting the output signal of the delay unit;

a NOR gate for NORing the output signal of the inverter and the output signal of the rising edge detector, a first NMOS transistor having a gate for receiving the output signal of the rising edge detector and a source for receiving a low level voltage;

a PMOS transistor having a gate for receiving the second write enable signal, a source for receiving a high level voltage, and a drain connect of the NMOS transistor, and a second NMOS transistor having a gate for receiving the output signal of the NOR gate, a drain for receiving the high level voltage, and a source commonly connected to the drain of the first NMOS transistor and the drain of the PMOS transistor for outputting the second power control signal.

7. The apparatus of claim 6, wherein said rising edge detector includes:

a delay unit for delaying the second write enable signal;

a first inverter for inverting the output signal of the delay unit;

a NAND gate for NANDing the output signal of the first inverter and the second write enable signal; and a second inverter for inverting the output signal of the NAND gate.

8. The apparatus of claim 6, wherein said first and power controllers output the first and second power control signals at predetermined levels different from each other when serial data is transmitted between the first and second serial access memories.

9. The apparatus of claim 6, wherein said first power controller outputs the first power control signal having a predetermined level higher than the second power control signal outputted from the second power controller when serial data is read from the memory cell array.

10. The apparatus of claim 6, wherein said first power controller outputs the first power control signal having a predetermined level lower than the second power control signal outputted from the second power controller when serial data is written in the memory cell array.

\* \* \* \* \*

UNITED STATES PATENT AND TRADEMARK OFFICE
CERTIFICATE OF CORRECTION

PATENT NO. : 5,754,489
DATED : May 19, 1998
INVENTOR(S) : Young Ho KIM

It is certified that error appears in the above-identified patent and that said Letters Patent is hereby corrected as shown below:

Column 8, line 56, change "a first" to --the first--.

Column 8, line 63, change "Signal" to --signal--.

Column 8, line 65, change "fox" to --for--.

Column 9, line 5, change "signal a" to --signal, a--.

Column 9, line 6, change "voltage and" to --voltage, and--.

Column 9, line 9 change "gate a" to --gate, a--.

Column 9, line 12, change "EMOS" to --PMOS--.

Column 9, line 41, change "controlling read" to --controlling a read--.

Column 10, line 34, change "first and power" to --first and second power--.

Signed and Sealed this

Twenty-third Day of March, 1999

Attest:

Q. TODD DICKINSON

*Attesting Officer*     *Acting Commissioner of Patents and Trademarks*